(12) United States Patent
Hagino et al.

(10) Patent No.: US 12,464,768 B2
(45) Date of Patent: Nov. 4, 2025

(54) VERTICAL SEMICONDUCTOR SWICHING ELEMENTS WITH SENSE CELL REGION

(71) Applicant: DENSO CORPORATION, Kariya (JP)

(72) Inventors: Takeshi Hagino, Kariya (JP); Kenta Gouda, Kariya (JP)

(73) Assignee: DENSO CORPORATION, Kariya (JP)

( * ) Notice: Subject to any disclaimer, the term of this patent is extended or adjusted under 35 U.S.C. 154(b) by 426 days.

(21) Appl. No.: 18/147,065

(22) Filed: Dec. 28, 2022

(65) Prior Publication Data

US 2023/0137999 A1  May 4, 2023

Related U.S. Application Data

(63) Continuation of application No. PCT/JP2021/024812, filed on Jun. 30, 2021.

(30) Foreign Application Priority Data

Jul. 3, 2020  (JP) .................................. 2020-115972

(51) Int. Cl.
   *H10D 30/66*  (2025.01)
   *H10D 62/10*  (2025.01)
   *H10D 62/17*  (2025.01)
   *H10D 64/27*  (2025.01)

(52) U.S. Cl.
   CPC ......... *H10D 30/669* (2025.01); *H10D 62/124* (2025.01); *H10D 62/213* (2025.01); *H10D 64/513* (2025.01)

(58) Field of Classification Search
   CPC .. H10D 30/669; H10D 62/124; H10D 62/213; H10D 64/513; H10D 12/038; H10D 12/481; H10D 30/0297; H10D 30/668; H10D 62/127; H10D 30/66
   See application file for complete search history.

(56) References Cited

U.S. PATENT DOCUMENTS

| 2006/0289915 | A1* | 12/2006 | Omura ................. H10D 30/669 257/E29.066 |
| 2009/0189219 | A1 | 7/2009 | Shinbori et al. |
| 2012/0129307 | A1 | 5/2012 | Shinbori et al. |
| 2012/0241851 | A1 | 9/2012 | Suzuki et al. |
| 2013/0154000 | A1 | 6/2013 | Shinbori et al. |

(Continued)

FOREIGN PATENT DOCUMENTS

| JP | H10-261704 A | 9/1998 |
| JP | H11-017179 A | 1/1999 |

(Continued)

*Primary Examiner* — Wasiul Haider
(74) *Attorney, Agent, or Firm* — Posz Law Group, PLC (57) ABSTRACT

In a semiconductor device, vertical semiconductor switching elements having a same structure are provided in a main cell region and a sense cell region. The sense cell region is defined as a quadrangular region surrounding an operating region of the semiconductor switching element formed as a sense cell, with (i) a lateral dimension of the sense cell region defined along one direction of the main cell region, and (ii) a longitudinal dimension of the sense cell region defined along a longitudinal direction that is orthogonal to the lateral direction. The longitudinal dimension of the sense cell region is equal to or greater than the lateral dimension of the sense cell region.

5 Claims, 10 Drawing Sheets

(56) References Cited

U.S. PATENT DOCUMENTS

| | | | |
|---|---|---|---|
| 2014/0103427 A1 | 4/2014 | Suzuki et al. | |
| 2015/0255587 A1* | 9/2015 | Nagaoka | H10D 62/127 |
| | | | 257/139 |
| 2018/0323258 A1* | 11/2018 | Tseng | H10D 62/115 |
| 2019/0279497 A1 | 9/2019 | Sekizawa et al. | |

FOREIGN PATENT DOCUMENTS

| | | |
|---|---|---|
| JP | 2005-174996 A | 6/2005 |
| JP | 2017-139291 A | 8/2017 |

* cited by examiner

VERTICAL SEMICONDUCTOR SWICHING ELEMENTS WITH SENSE CELL REGION

CROSS REFERENCE TO RELATED APPLICATION

The present application is a continuation application of International Patent Application No. PCT/JP2021/024812 filed on Jun. 30, 2021, which designated the U.S. and claims the benefit of priority from Japanese Patent Application No. 2020-115972 filed on Jul. 3, 2020. The entire disclosures of all of the above applications are incorporated herein by reference.

TECHNICAL FIELD

The present disclosure generally relates to a semiconductor device that (i) includes vertical semiconductor switching elements having the same structure in a main cell region and a sense cell region, and (ii) detects an electric current flowing in the main cell region based on an electric current flowing in the sense cell region.

BACKGROUND ART

In a semiconductor device, vertical semiconductor switching elements having the same structure may be provided in both a main cell region and a sense cell region, and an electric current flowing in the main cell region may be detected based on an electric current flowing in the sense cell region.

Such a semiconductor device has a planar gate electrode, and has a structure in which a current detecting element is arranged as a sense cell region between main elements formed in a main cell region. A high resistance region is provided between the main element and the sense element so as to perform electrical isolation therebetween. By adopting such a structure, carrier paths are matched and an accuracy of the detected current flowing through the current detecting element is improved.

SUMMARY

According to an aspect of the present disclosure, in a semiconductor device, vertical semiconductor switching elements has a same structure in a main cell region and a sense cell region. The sense cell region is defined as a quadrangular region surrounding an operating region of the semiconductor switching element formed as a sense cell, with (i) a lateral dimension of the sense cell region defined along one direction of the main cell region, and (ii) a longitudinal dimension of the sense cell region defined along a longitudinal direction that is orthogonal to the lateral direction of the sense cell region.

In the basic structure of the semiconductor device, the longitudinal dimension of the sense cell region may be set equal to or greater than the lateral dimension of the sense cell region. Alternatively, a drift layer in the sense cell region may be provided with a resistance component layer that makes the drift layer in the sense cell region higher in resistance than the drift layer in the main cell region.

BRIEF DESCRIPTION OF THE DRAWINGS

The above and other objects, features and advantages of the present disclosure will become more apparent from the following detailed description made with reference to the accompanying drawings. In the drawings.

DESCRIPTION OF EMBODIMENTS

In a semiconductor device that detects an electric current flowing through a main element based on an electric current flowing through a current detecting element, a setting of a gate voltage dependency of the current detecting element is important in order to actually improve a detection accuracy of the current detecting element. Thus, a semiconductor device having a structure capable of performing a setting about the gate voltage dependency is desired.

It is an object of the present disclosure to provide a semiconductor device having a structure capable of setting a gate voltage dependency.

According to an aspect of the present disclosure, in a semiconductor device, vertical semiconductor switching elements having a same structure are provided in a main cell region and a sense cell region. The vertical semiconductor switching element includes: a drift layer of a first conductivity type; a channel layer of a second conductivity type, arranged on the drift layer; a first impurity region of the first conductivity type, arranged at a surface layer portion in the channel layer, the first impurity region having an impurity concentration higher than that of the drift layer; a gate insulating film configured to cover the channel layer in an area between the first impurity region and the drift layer; a gate electrode layer arranged in stripe-like plural lines extending in one direction serving as a longitudinal direction and provided at a surface of the gate insulating film to form a channel region; a second impurity region of the first or second conductivity type, arranged on an opposite side of the channel layer with the drift layer interposed therebetween, the second impurity region having an impurity concentration higher than that of the drift layer; an upper electrode electrically connected to the first impurity region and the channel layer; and a lower electrode electrically connected to the second impurity region. The sense cell region is defined as a quadrangular region surrounding an operating region of the semiconductor switching element formed as a sense cell, with (i) a lateral dimension of the sense cell region defined along the one direction of the main cell region, and (ii) a longitudinal dimension of the sense cell region defined along a longitudinal direction that is orthogonal to the lateral direction of the sense cell region. In this state, the longitudinal dimension of the sense cell region is equal to or greater than the lateral dimension of the sense cell region.

In such manner, the dimensions of the sense cell region are suitably set so that the longitudinal dimension of the sense cell region is equal to or greater than the lateral dimension thereof. A main current flowing through the main cell region is detected based on a ratio of a sense current flowing through the sense cell region to the main current flowing through the main cell region, which may hereinafter be referred to as a sense ratio. Therefore, if an amount of change in the sense ratio with respect to a change in a gate voltage is large, the sense ratio can be detected with high sensitivity and accuracy. When considering a circuit for detecting the sense ratio or sense current of a semiconductor device that drives a vertical semiconductor switching element with a feedback circuit, the degree of freedom in circuit design for controlling the gate voltage with a gate driver circuit is improvable in the above-described manner. Thus, by designing and setting such a circuit, a gate voltage dependency can be set.

According to another aspect of the present disclosure, in a semiconductor device, vertical semiconductor switching elements having a same structure are provided in a main cell region and a sense cell region. The semiconductor switching includes: a drift layer of a first conductivity type; a channel layer of a second conductivity type, arranged on the drift layer; a first impurity region of the first conductivity type, arranged at a surface layer portion in the channel layer, and having an impurity concentration higher than that of the drift layer; a gate insulating film configured to cover the channel layer in an area between the first impurity region and the drift layer; a gate electrode layer arranged in stripe-like plural lines extending in one direction serving as a longitudinal direction and provided at a surface of the gate insulating film to form a channel region; a second impurity region of the first or second conductivity type, arranged on an opposite side of the channel layer with the drift layer interposed therebetween, the second impurity region having an impurity concentration higher than that of the drift layer; an upper electrode electrically connected to the first impurity region and the channel layer; and a lower electrode electrically connected to the second impurity region. The drift layer in the sense cell region is provided with a resistance component layer as a part of the drift layer, so as to make the drift layer in the sense cell region higher in resistance than the drift layer in the main cell region.

Because the drift layer in the sense cell region is provided with the resistance component layer, it is possible to reduce the sense current flowing through the sense cell region. Therefore, the gate voltage dependency is matched substantially in the sense cell region and the main cell region. Thus, it is possible to suitably set the gate voltage dependency.

For example, a pitch of the gate electrode layers arranged in stripes in the sense cell region may be larger than a pitch of the gate electrode layers arranged in stripes in the main cell region.

The sense cell region may include a plurality of operating regions of the semiconductor switching elements respectively formed as the sense cell, and may be defined as a quadrangular region surrounding the plurality of operating regions. For example, the plurality of operating regions may include two operating regions arranged side-by-side in the longitudinal direction of the sense cell region.

The semiconductor switching element may be provided with a trench extending in the one direction and penetrating from the first impurity region through the channel layer to reach the drift layer, and the gate electrode layer may be provided to extend in the trench with the gate insulating film interposed therebetween.

Hereinafter, embodiments of the present disclosure will be described with reference to the drawings. In the following embodiments, the same or equivalent parts are denoted by the same reference numerals.

First Embodiment

The first embodiment of the present disclosure will be described. In a semiconductor device of the present embodiment, n-type channel vertical MOSFETs are provided as vertical semiconductor switching elements having the same structure in both of a main cell region and a sense cell region. Hereinafter, a structure of the semiconductor device according to the present embodiment will be described with reference to FIGS. 1 to 4.

Figure 1:
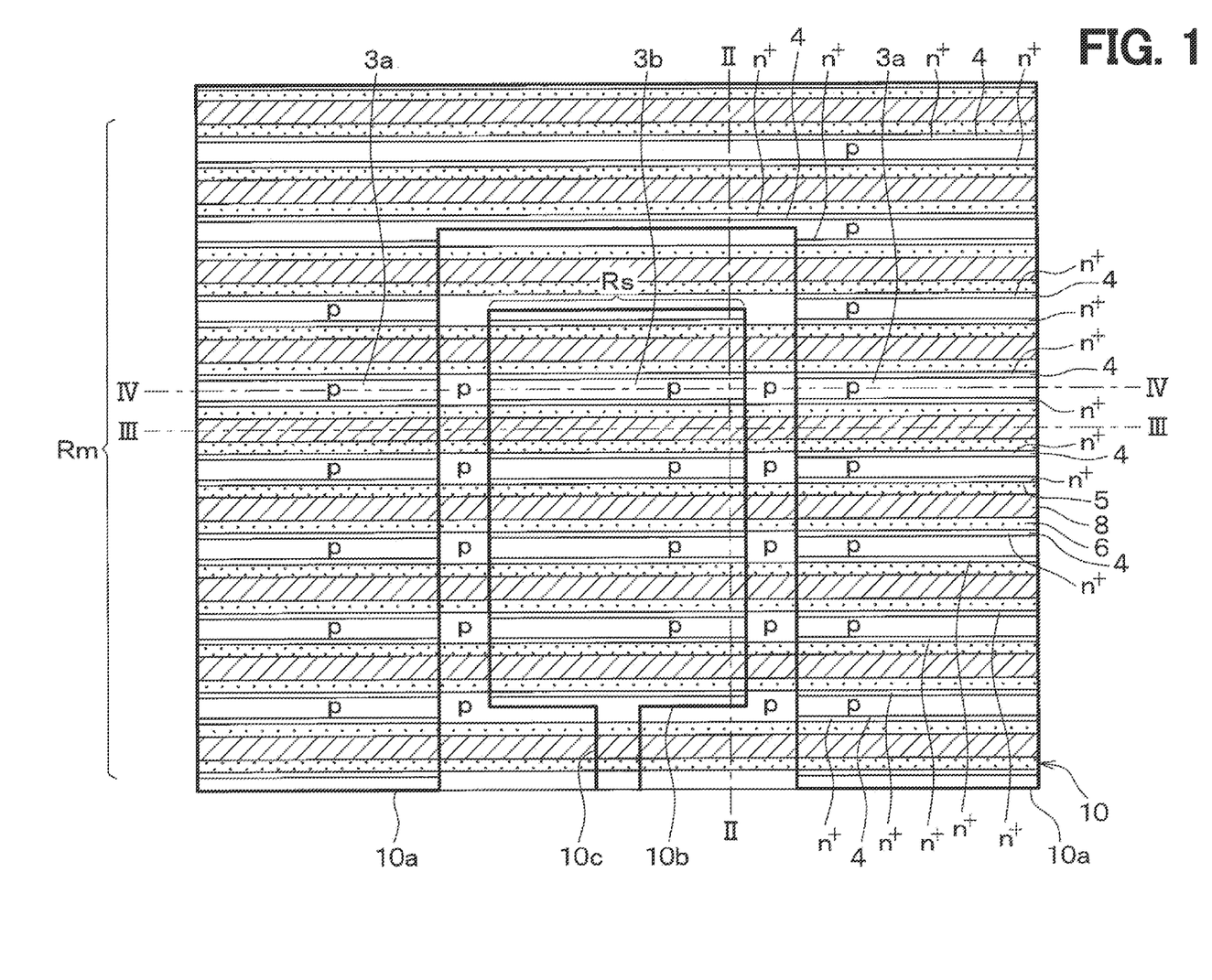
FIG. 1 is a top layout view of a semiconductor device according to a first embodiment.

As shown in FIG. 1, the semiconductor device according to the present embodiment includes a main cell region Rm and a sense cell region Rs. The main cell region Rm is formed in a partially-notched quadrangular shape, and the sense cell region Rs is arranged in the main cell region Rm and formed to be surrounded by the main cell region Rm. Although FIG. 1 shows only the vicinity of the sense cell region Rs in the main cell region Rm, the main cell region Rm is actually a sufficiently large area, for example, 100,000,000 times greater than the sense cell region Rs.

In both the main cell region Rm and the sense cell region Rs, n-type channel vertical MOSFETs having the same structure are formed.

Figure 2:
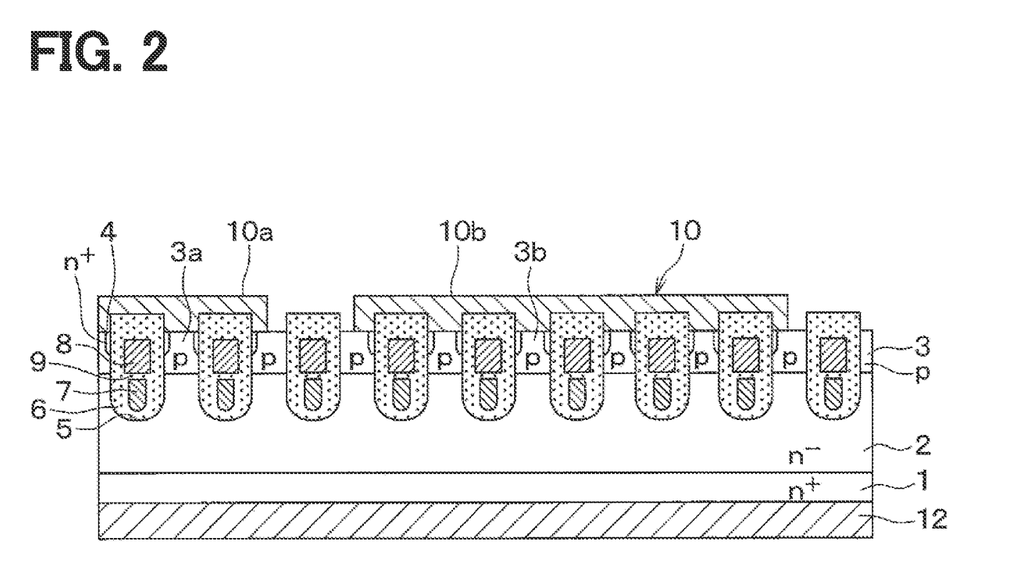
FIG. 2 is a diagram showing a cross-sectional view taken along a line II-II of FIG. 1.

As shown in FIG. 2, the semiconductor device is made of an $n^+$-type semiconductor substrate 1 which is made of a semiconductor material such as silicon having a high impurity concentration. For example, the semiconductor substrate 1 has a thickness of 10 to 300 μm and an n type impurity concentration of about $1 \times 10^{12}$ to $1 \times 10^{18}$ cm$^{-3}$. An $n^-$-type drift layer 2 having an impurity concentration lower than that of the $n^+$-type semiconductor substrate 1 is formed on a surface of the $n^+$-type semiconductor substrate 1, and a p-type channel layer 3 having a relatively low impurity concentration is formed at a desired position of the $n^-$-type drift layer 2. The $n^-$-type drift layer 2 has, for example, a thickness of 1 to 10 μm and an n type impurity concentration of about $1 \times 10^{12}$ to $1 \times 10^{18}$ cm$^{-3}$. Further, the p-type channel layer 3 has a thickness of 0 to 2 μm and a p-type impurity concentration of about $1 \times 10^{12}$ to $1 \times 10^{18}$ cm$^{-3}$.

Figure 4:
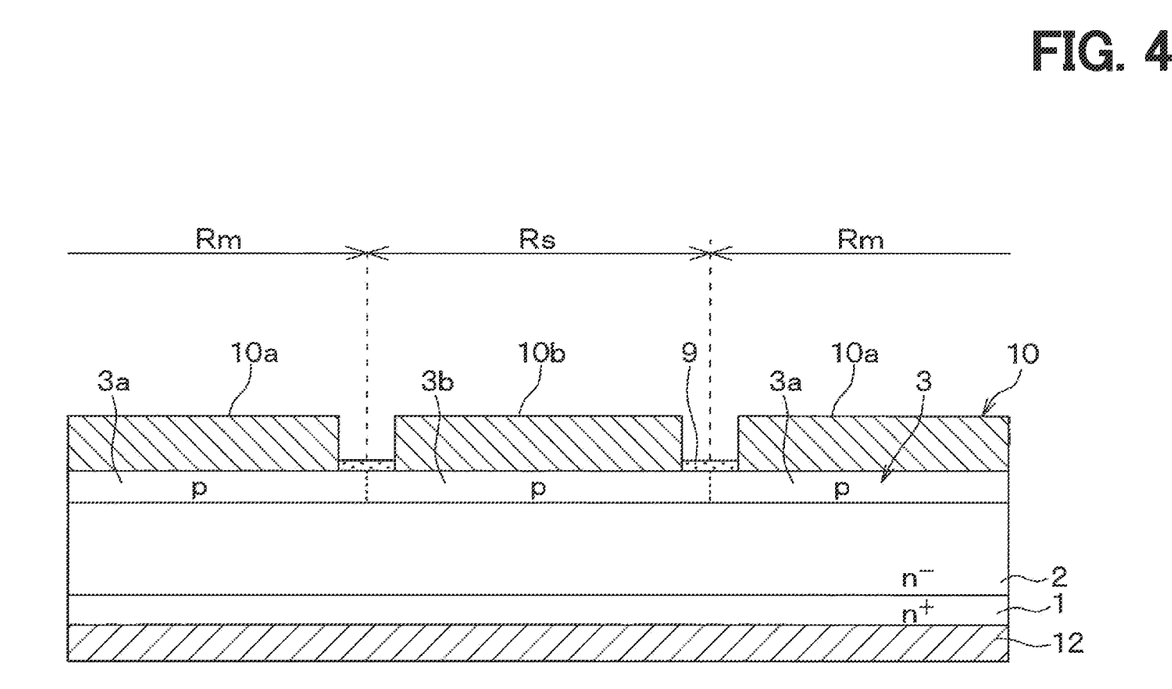
FIG. 4 is a sectional view taken along a line IV-IV of FIG. 1.

The p-type channel layer 3 is formed by ion-implanting a p-type impurity into the $n^-$-type drifting layer 2 or by using a similar method. In the present embodiment, as shown in FIG. 4, the p-type channel layer 3 is formed as a structure that continuously connects a main channel layer 3a formed in the main cell region Rm and a sense channel layer 3b formed in the sense cell region Rs.

In a surface layer portion of the p-type channel layer 3, there is an $n^+$-type impurity region 4 corresponding to a first impurity region, which constitutes a source region and has an impurity concentration higher than that of the $n^-$-type drift layer 2. The $n^+$-type impurity region 4 has, for example, a thickness of 0 to 2 μm and an $n^-$-type impurity concentration of about $1 \times 10^{12}$ to $1 \times 10^{18}$ cm$^{-3}$.

Further, a trench 5 is formed to extend from a substrate surface side, to penetrate through the $n^+$-type impurity region 4 and the p-type channel layer 3, and to reach the $n^-$-type drift layer 2. A gate insulating film 6 is formed to cover an inner wall surface of the trench 5. A shield electrode 7 and a gate electrode layer 8 respectively made of a doped Poly-Si are arranged inside the trench 5 via the gate insulating film 6 to form a two-layered structure. The shield electrode 7 is constantly held and fixed at a source potential to reduce a capacitance between a gate and a drain, and improve the electrical properties of the MOSFET. The gate electrode layer 8 performs a MOSFET switching operation, and defines a channel in the p-type channel layer 3 on side surfaces of the trench 5 when a gate voltage is applied.

An insulating film 9 is formed between the shield electrode 7 and the gate electrode layer 8, so that the shield electrode 7 and the gate electrode layer 8 are insulated by using the insulating film 9. The trench 5, the gate insulating film 6, the shield electrode 7, the gate electrode layer 8, and the insulating film 9 are configured to form a trench gate structure. The trench gate structure extending along a direction orthogonal to drawing plane of FIG. 2, for example, has a stripe-like layout or arrangement, which is a plurality of trench gates arranged in parallel along an up-down direction of FIG. 1, or along a lateral direction (i.e., left-right direction) of FIG. 2. The formation pitch of the trench gate structure is arbitrary, and the pitch may be set to 1 to 2 μm, for example.

Although the trench gate structure is formed in an area between the main cell region Rm and the sense cell region Rs, the $n^+$-type impurity region 4 is not formed in the area between the main cell region Rm and the sense cell region Rs, thereby not forming a vertical MOSFET.

Figure 3:
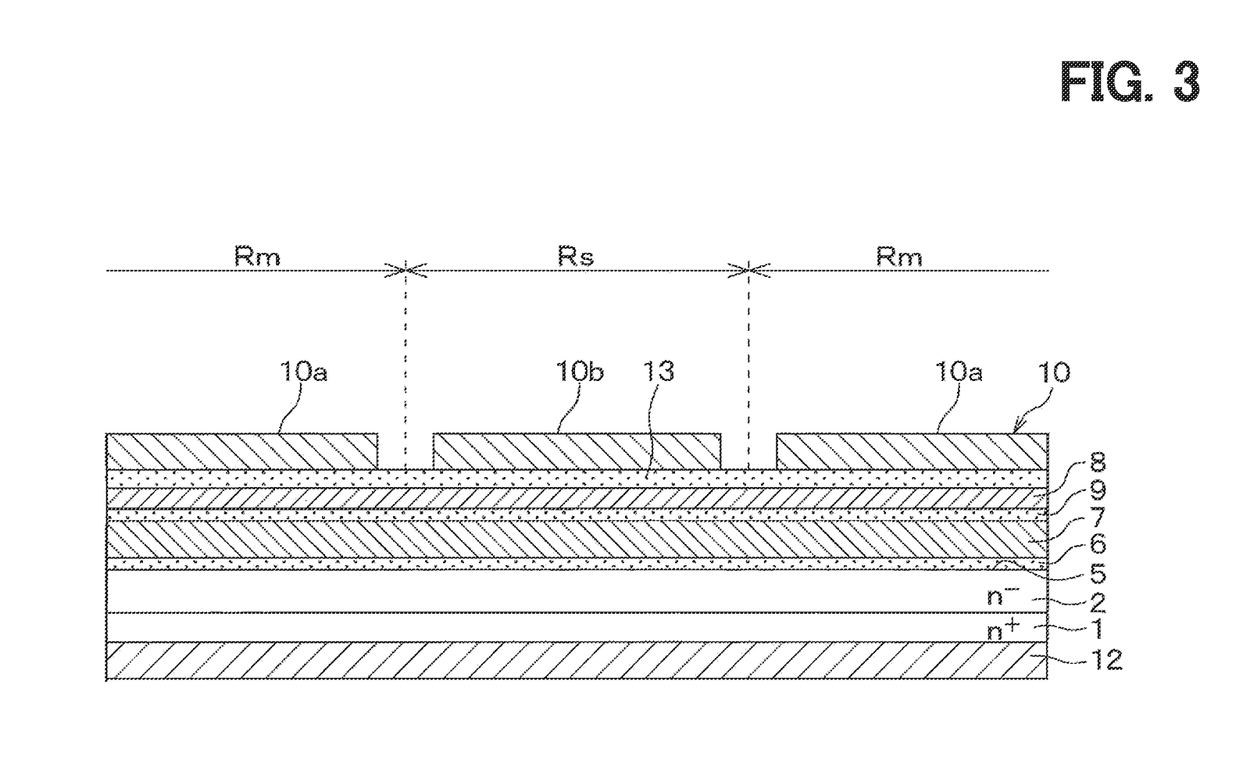
FIG. 3 is a cross-sectional view taken along a line III-III in FIG. 1.

Further, as shown in FIG. 3, the trench 5 is continuously connected between the main cell region Rm and the sense cell region Rs, to extend the main cell region Rm and the sense cell region Rs. Then, the shield electrode 7 and the gate electrode layer 8, which are buried in the trench 5, are also continuously connected to reach or extend into both of the main cell region Rm and the sense cell region Rs.

Furthermore, although not shown in the drawing, at one end of the trench 5 in the trench longitudinal direction, the shield electrode 7 extends to go outside the main cell region Rm relative to the gate electrode layer 8, that is, extends to a farther away portion of the main cell region Rm departing from the sense cell region Rs. Then, with such a portion exposed from a surface of the p-type channel layer 3 as a shield liner, electrical connection of the shield electrode 7 with an upper electrode 10 having a source potential, which will be described later, is performed.

Similarly, at an another end of the trench 5 in the trench longitudinal direction, the gate electrode layer 8 extends to the outside of the main cell region Rm from the shield electrode 7, that is, extends to a farther away portion of the main cell region Rm, departing from the sense cell region Rs. Then, such a portion is exposed from the surface of the p-type channel layer 3 serving as a gate liner, and is electrically connected to a gate electrode (not shown).

Further, an interlayer insulating film 13 made of an oxide film or the like is formed to cover the gate electrode layer 8, and an upper electrode 10 corresponding to a source electrode, and a gate electrode (not shown) are formed on the interlayer insulating film 13. The upper electrode 10 is electrically connected to the $n^+$-type impurity regions 4 and the p-type channel layer 3 through portions where the interlayer insulating film 13 is not formed, for example, through contact holes. The gate electrode is also electrically connected to the gate electrode layer 8 via a gate liner through a portion where the interlayer insulating film 13 is not formed, such as a contact hole.

The upper electrode 10 is divided into a main electrode 10a formed in the main cell region Rm, and a sense electrode 10b formed in the sense cell region Rs, and those electrodes 10a and 10b are separated from each other by a predetermined distance. The main electrode 10a is formed over substantially the entire main cell region Rm, and is configured to have a partially-notched quadrangular shape. The sense electrode 10b has a quadrangular shape, and is disposed to be surrounded by the main electrode 10a. From one end side of the sense electrode 10b corresponding to a cut-out portion of the main cell region Rm, a lead-out line 10c extends to the outside of the main cell region Rm.

Further, a lower electrode 12 corresponding to a drain electrode is formed on a surface of the $n^+$-type semiconductor substrate 1, opposite to the $n^-$-type drift layer 2. The configuration described above provides a basic structure of the vertical MOSFET. As shown in FIG. 2, the main cell region Rm and the sense cell region Rs are configured by collecting multiple cells forming the vertical MOSFET.

As described above, the semiconductor device having the vertical MOSFET is formed. In such a semiconductor device, when a gate voltage is applied to the gate electrode layer 8 of the vertical MOSFET provided in the main cell region Rm and the sense cell region Rs, a channel is formed on a surface of the p-type channel layer 3 that is in contact with the trench 5. In such manner, electrons injected from the upper electrode 10 reach the $n^-$-type drift layer 2 after passing through the channel formed in the p-type channel layer 3 from the $n^+$ type impurity region 4, thereby performing an operation of flowing an electric current between the upper electrode 10 and the lower electrode 12, Then, vertical MOSFETs having the same cell structure are formed respectively in the main cell region Rm and the sense cell region Rs, and sizes of the cell areas of the vertical MOSFETs provided in the main cell region Rm and the sense cell region Rs, in other words, the number of cells provided in the main cell region Rm and the sense cell region Rs, are set to have a predetermined ratio. Therefore, a sense current, obtained by reducing the main current flowing through the main cell region Rm by a predetermined ratio, passes through the sense cell region Rs. Thus, by outputting the sense current flowing through the sense cell region Rs to the outside, the main current flowing through the main cell region Rm can be detected.

Figure 5:
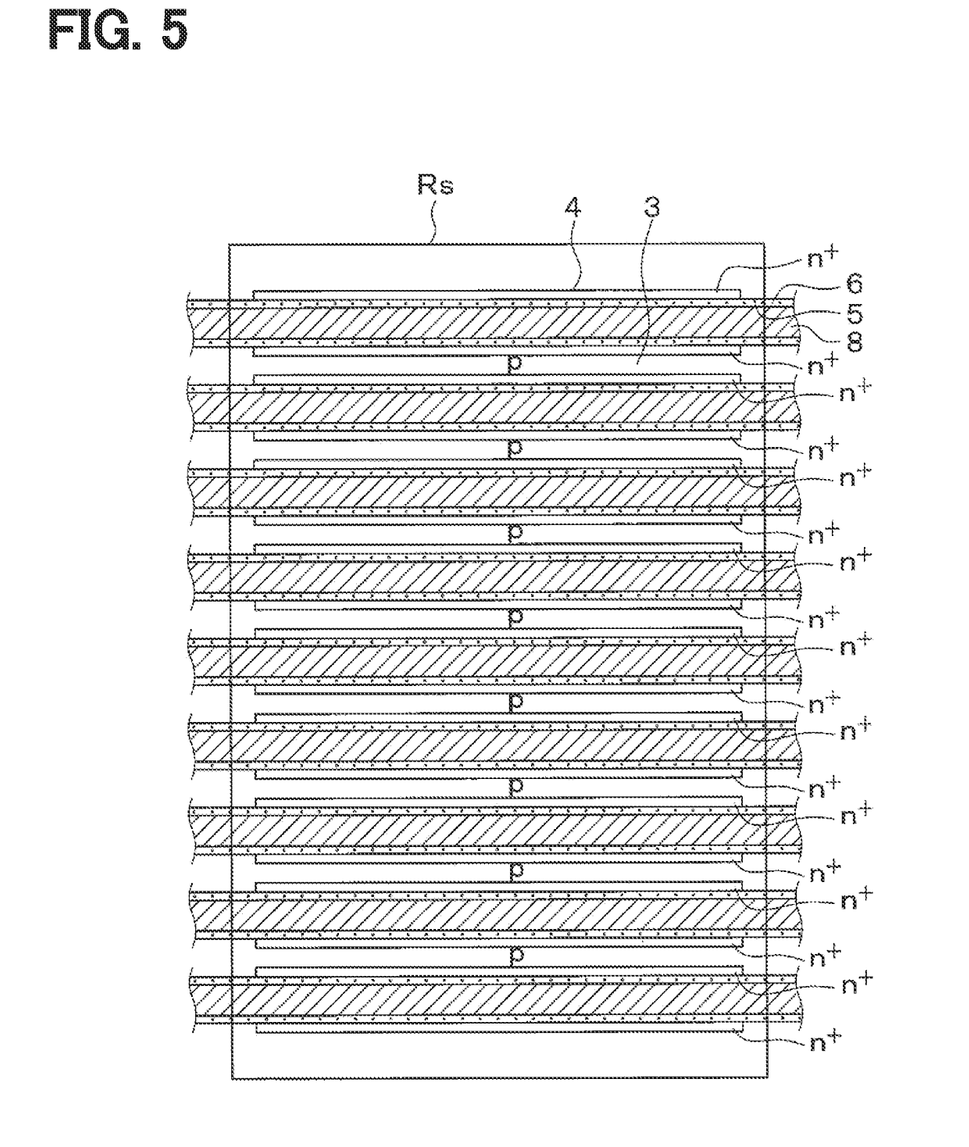
FIG. 5 is a top layout diagram illustrating a sense cell region.

In such a semiconductor device, a dimensional relationship between a lateral dimension and a longitudinal dimension is defined in a top view seen from the paper top of FIG. 1, based on an assumption that a trench gate longitudinal direction is the lateral direction and a direction orthogonal to the lateral direction is the vertical direction. The sense cell region Rs is a quadrangular-shaped portion that is used as an operating region of the vertical MOSFET formed as a sense cell. That is, the sense cell region Rs is a region where the $n^+$-type impurity region 4 serving as a source region is formed along the trench gate structure, so that, when a gate voltage is applied to the gate electrode layer 8, the sense cell region Rs performs a MOS operation to flow an electric current. Specifically, as shown in FIG. 5, the sense cell region Rs is shown as a region collectively surrounding a plurality of $n^+$-type impurity regions 4 brought into contact with the sense electrode 10b.

Then, the vertical dimension (i.e., longitudinal dimension) of the sense cell region Rs is set to be equal to or greater than the lateral dimension. Thus, a ratio of the vertical dimension (i.e., longitudinal dimension) to the lateral dimension of the sense cell region Rs is set to 1 or more. More preferably, the dimension of the current path (hereinafter referred to as current path dimension) obtained by subtracting the width of the trench gate structure from the longitudinal dimension of the sense cell region Rs is made equal to or greater than the lateral dimension.

Figure 6:
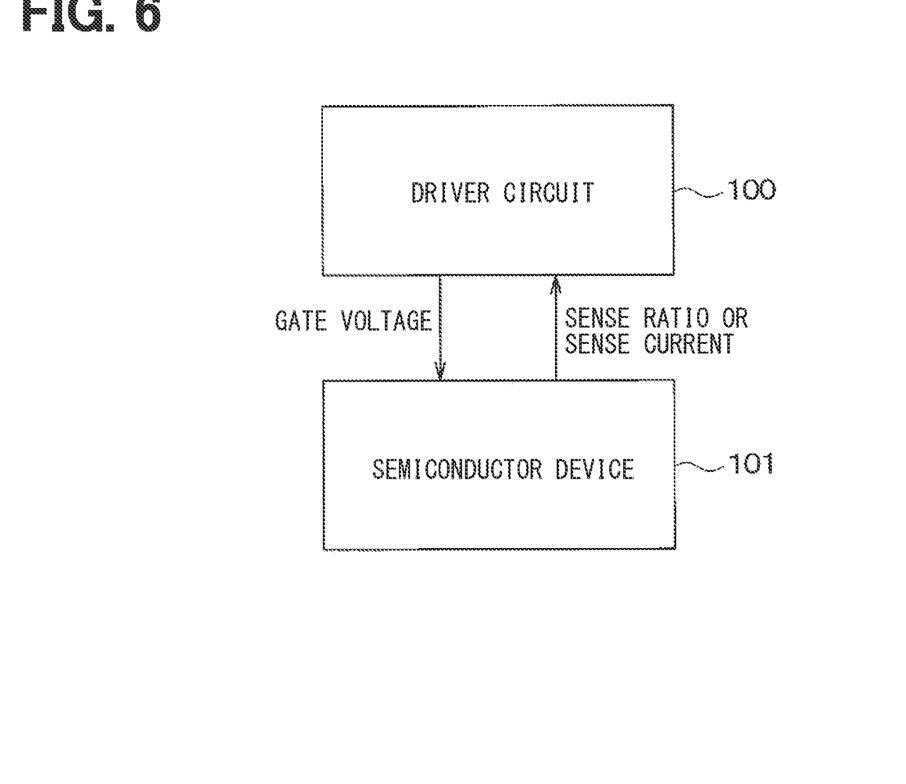
FIG. 6 is a block diagram showing how a semiconductor device is driven by a gate driver circuit.

The main current flowing through the main cell region Rm is detected based on the sense ratio. Specifically, as shown in FIG. 6, a gate voltage is applied from a gate driver circuit 100 to a semiconductor device 101 having the main cell region Rm and the sense cell region Rs, and the sense ratio or the sense current at such time is fed back to the gate driver circuit 100. The gate driver circuit 100 includes a feedback circuit configured to detect the sense ratio or the sense current. The gate voltage outputted by the gate driver circuit 100 is adjusted, so as to control a desired main current.

Figure 7:
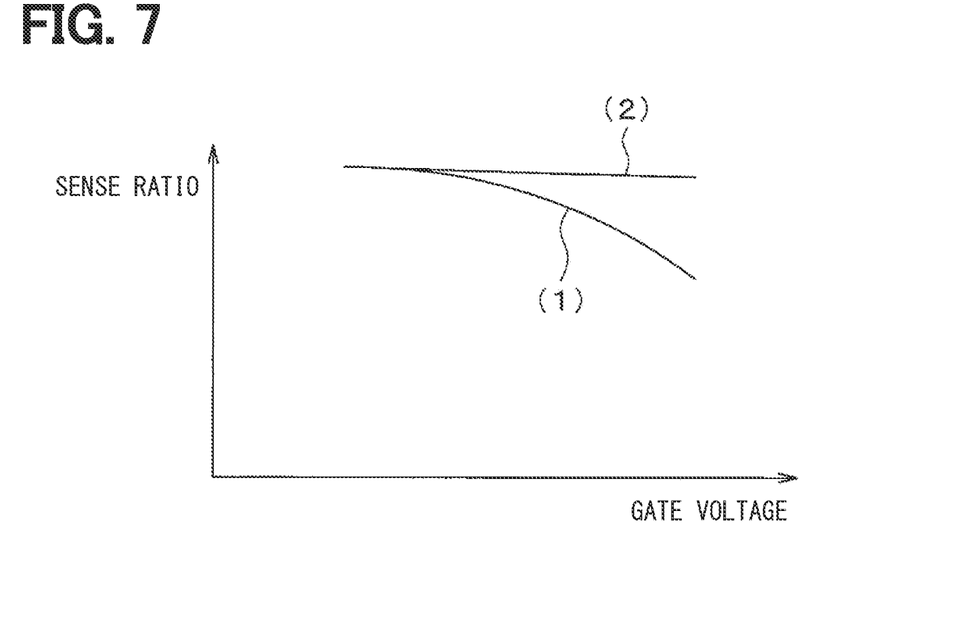
FIG. 7 is a diagram showing a relationship between a sense ratio and a gate voltage.

FIG. 7 shows a dependency of the sense ratio on the gate voltage (Vgs) (hereinafter referred to as Vgs dependency). In FIG. 7, the characteristics (1) shows the Vgs dependency when the longitudinal dimension (i.e., vertical dimension) of the sense cell region Rs is equal to or greater than the lateral dimension as in the present embodiment, and characteristics (2) shows a Vgs dependency when the lateral dimension is greater than the longitudinal dimension (i.e., vertical dimension).

As shown in FIG. 7, the sense ratio has the Vgs dependency. However, when the lateral dimension of the sense cell region Rs is made greater than the longitudinal dimension, the change in the sense ratio with respect to the change in the gate voltage of the element is small. In this case, although the sense ratio becomes smaller as the gate voltage increases, the sense ratio is almost constant regardless of the magnitude of the gate voltage. In contrast, when the longitudinal dimension of the sense cell region Rs is made greater than the lateral dimension as in the present embodiment, the change in the sense ratio with respect to the change in the gate voltage of the element is great. In the present embodiment, as the gate voltage becomes greater, the sense ratio becomes smaller. In addition, in the present embodiment, the rate of decrease in the sense ratio increases, as the gate voltage increases. On the other hand, in an electric current sensing method or circuit having an external resistance, in which the gate driver circuit 100 is used together, the gate voltage dependency of the entire system including the resistance is suppressed by having the gate voltage dependency in the sense cell itself, thereby enabling a high sensitivity detection of the sense ratio.

The sense ratio or the sense current is fed back to the gate driver circuit 100 as described above. A sense ratio may be fed back to the gate driver circuit 100 when the gate voltage is a predetermined value, and the gate voltage outputted by the gate driver circuit 100 may also be adjusted. At such time, if the amount of change in the sense ratio with respect to the change in the gate voltage is great, the sense ratio can be detected with high sensitivity and accuracy. Therefore, when considering a circuit for detecting the sense ratio or sense current of a semiconductor device that drives a vertical MOSFET with a feedback circuit, the degree of freedom in circuit design for controlling the gate voltage with the gate driver circuit 100 can be improved. Therefore, a setting of Vgs-dependency is made possible.

Modification of the First Embodiment

In the first embodiment described above, the longitudinal dimension (i.e., vertical dimension) of the sense cell region Rs is equal to or greater than the lateral dimension thereof. However, such a configuration may also be realized by various structures.

Figure 8:
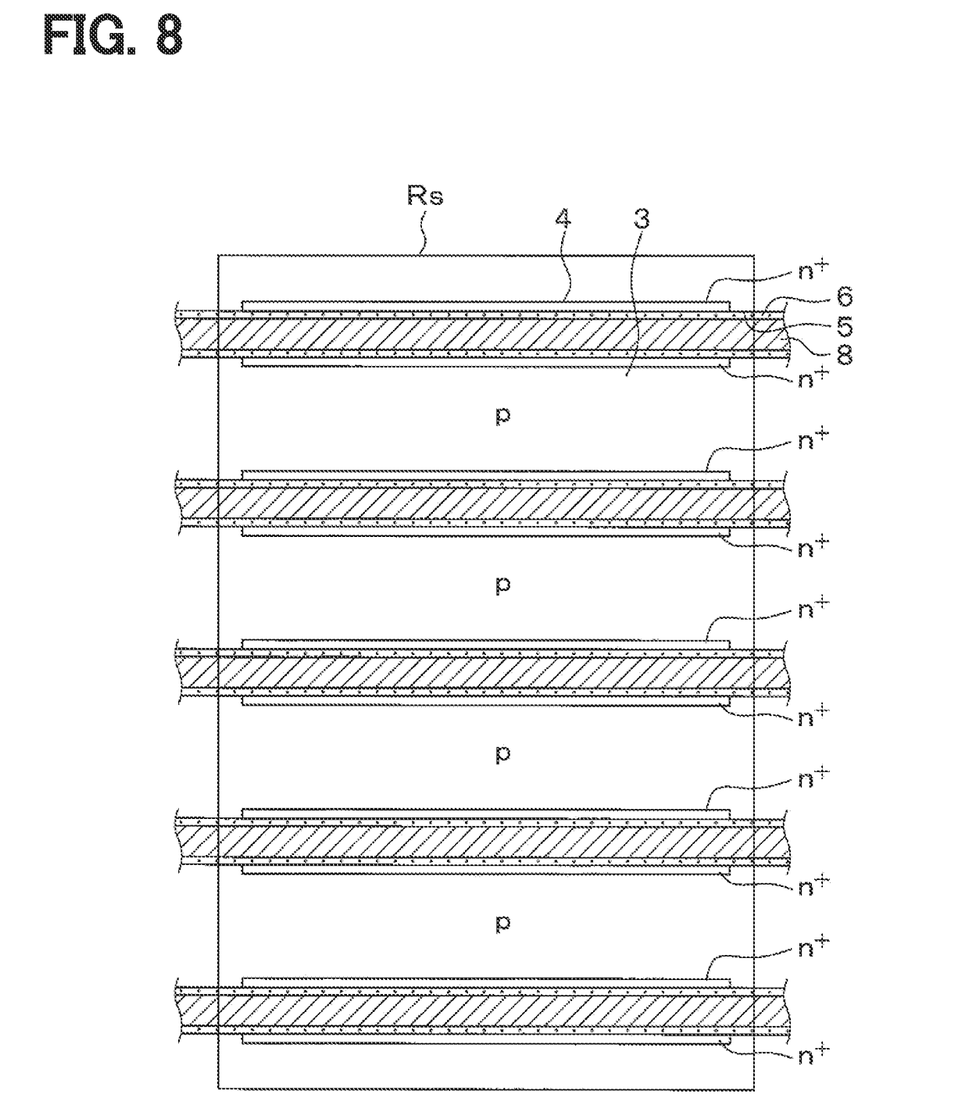
FIG. 8 is a top layout diagram illustrating the sense cell region in a semiconductor device according to a modification of the first embodiment.

For example, as shown in FIG. 8, in the sense cell region Rs, the pitch of the trench gate structure may be made larger than that of the main cell region Rm. For example, the pitch of the gate electrode layer 8 is made larger than that in the main cell region Rm, and the trench gate structure may partially be omitted. In such case, it becomes easier to make the current path dimension in the sense cell region Rs equal to or greater than the lateral dimension.

Figure 9:
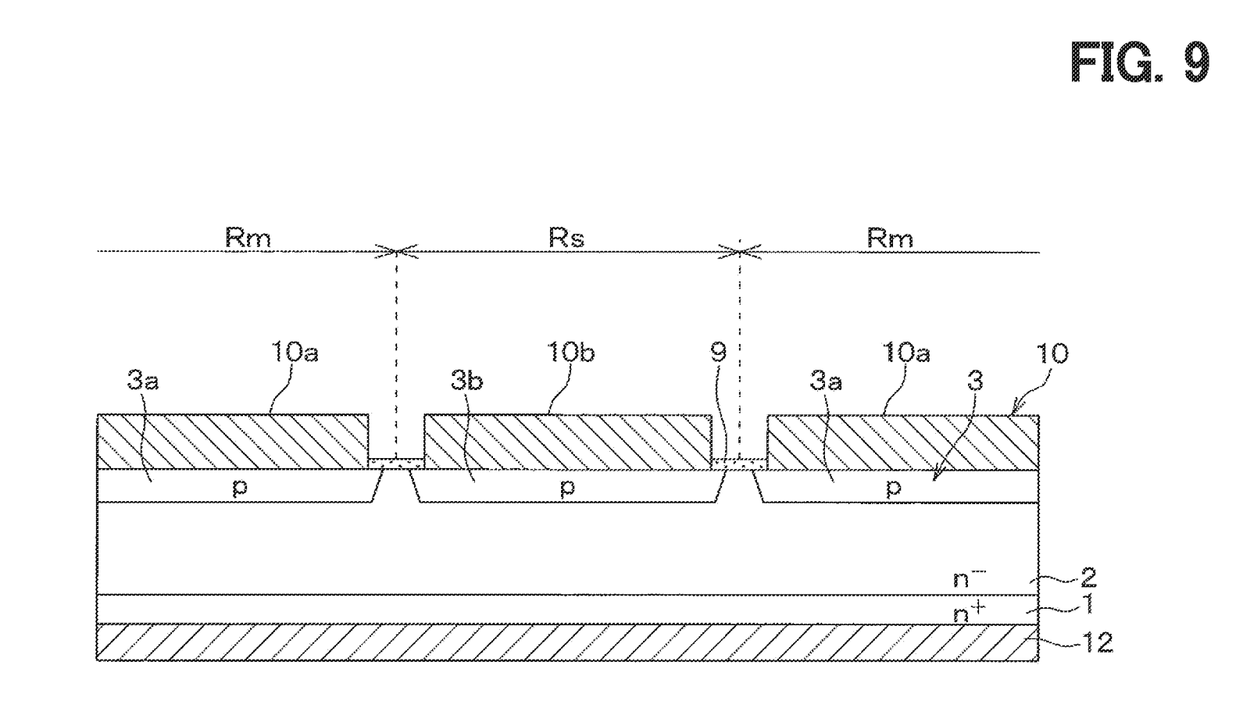
FIG. 9 is a cross-sectional view showing a structure in which a p-type channel layer is separated according to a modification of the first embodiment.

Further, in the above-described first embodiment, the p-type channel layer 3 formed in the main cell region Rm and the sense cell region Rs is continuously connected. However, as shown in FIG. 9, the main cell region Rm and the sense cell region Rs may also be provided with the p-type channel layer 3 as separated p-type channel layer parts 3a, 3b.

Figure 10:
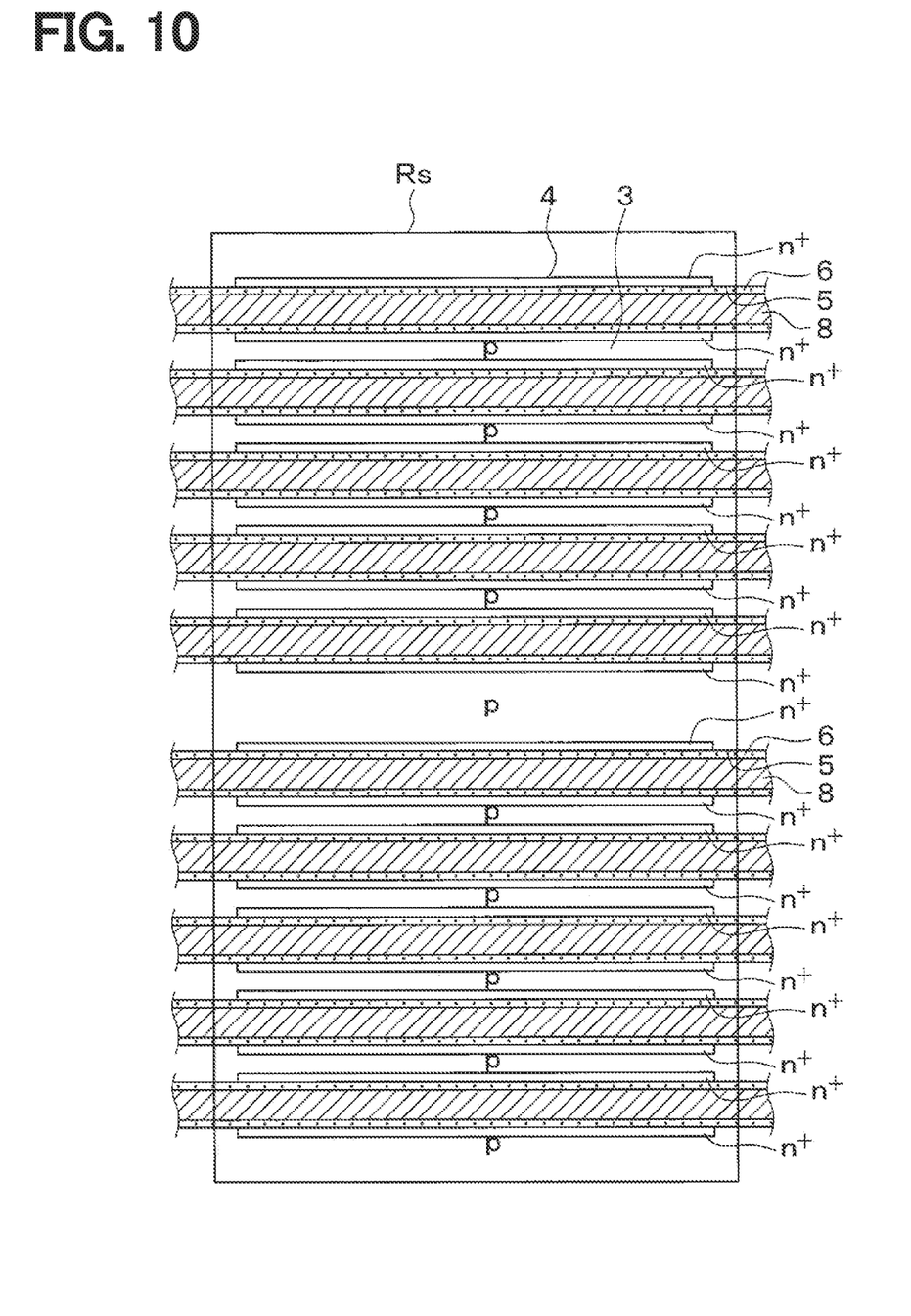
FIG. 10 is a top layout diagram illustrating a sense cell region according to a modification of the first embodiment.

Further, the operating region of the sense cell region Rs may be divided into a plurality of regions. As shown in FIG. 10, for example, the operating region of the sense cell region Rs may be a structure in which two operating regions are arranged side by side in a direction orthogonal to the longitudinal direction of the trench gate structure. Specifically, a plurality of groups each having plural trench gate structures may be formed in stripes, and the pitch between adjacent trench gate structures in adjacent groups may be made larger than the pitch between trench gate structures in the same group. In such case, the p-type channel layers 3 in the adjacent groups may be separated in the sense cell region Rs. As described above, when the sense cell region Rs is divided into a plurality of operating regions, the intended effects of the present embodiment are achievable as long as the total longitudinal dimension of the plurality of operating regions is equal to or greater than the lateral dimension thereof.

Second Embodiment

The second embodiment of the present disclosure will be described. The present embodiment is different from the first embodiment in that the gate voltage dependency is set by a different structure, with the rest of the configuration being same as the first embodiment. Therefore, the different parts different from the first embodiment will be mainly described in the following.

Figure 11:
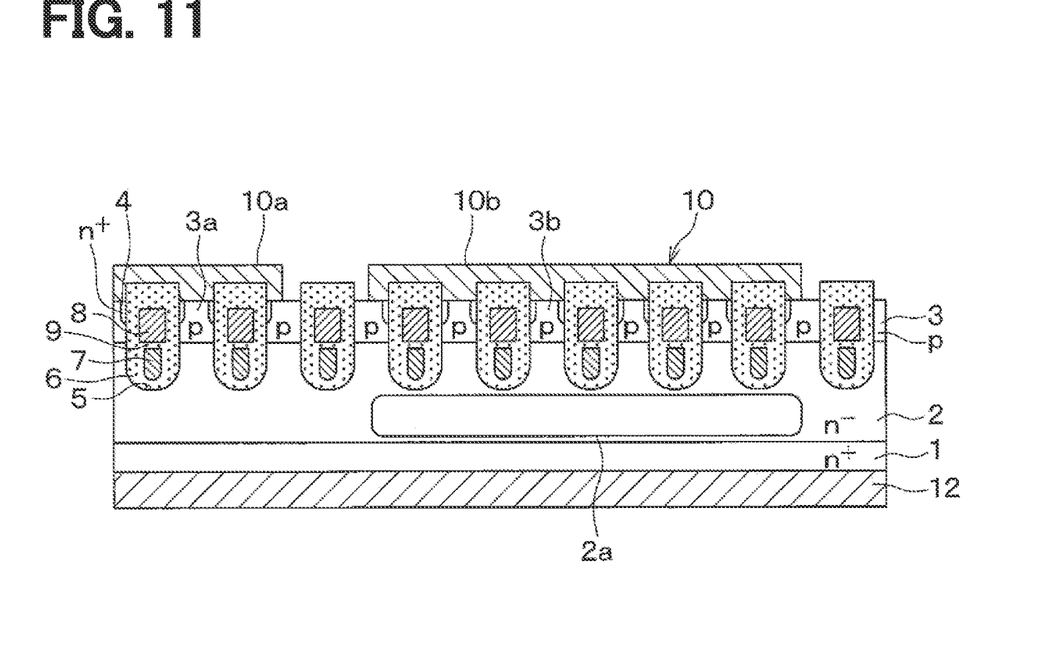
FIG. 11 is a cross-sectional view of a semiconductor device according to a second embodiment.

As shown in FIG. 11, in the present embodiment, a resistance component layer 2a is provided in the sense cell region Rs below the trench gate structure, as a part of the n⁻-type drift layer 2 having a high resistance. The resistance component layer 2a is formed by ion-implanting p-type impurities into the n⁻-type drift layer 2, for example. By providing the resistance component layer 2a in the sense cell region Rs, the resistance value of the n⁻-type drift layer 2 becomes higher in the sense cell region Rs than in the main cell region Rm. For example, the resistive component layer 2a has a thickness of about 0 to 5 µm and an n⁻-type impurity concentration of about $1 \times 10^{12}$ to $1 \times 10^{18}$ cm$^{-3}$.

In FIG. 2, vertical MOSFETs having the same structure are formed in the main cell region Rm and the sense cell region Rs; however, current paths of the main current and the sense current in the operating time become respectively different. That is, when a size of the formation area of the main cell region Rm and a size of the formation area of the sense cell region Rs are compared, the formation area of the sense cell region Rs is sufficiently smaller than that of the main cell region Rm. Therefore, in the sense cell region Rs, a ratio of current paths flowing from the outside to the inside of the region is greater than in the main cell region Rm, and the electric current easily flows into the sense cell region Rs. Due to such difference, Vgs dependency does not match between the sense cell region Rs and the main cell region Rm.

Figure 12:
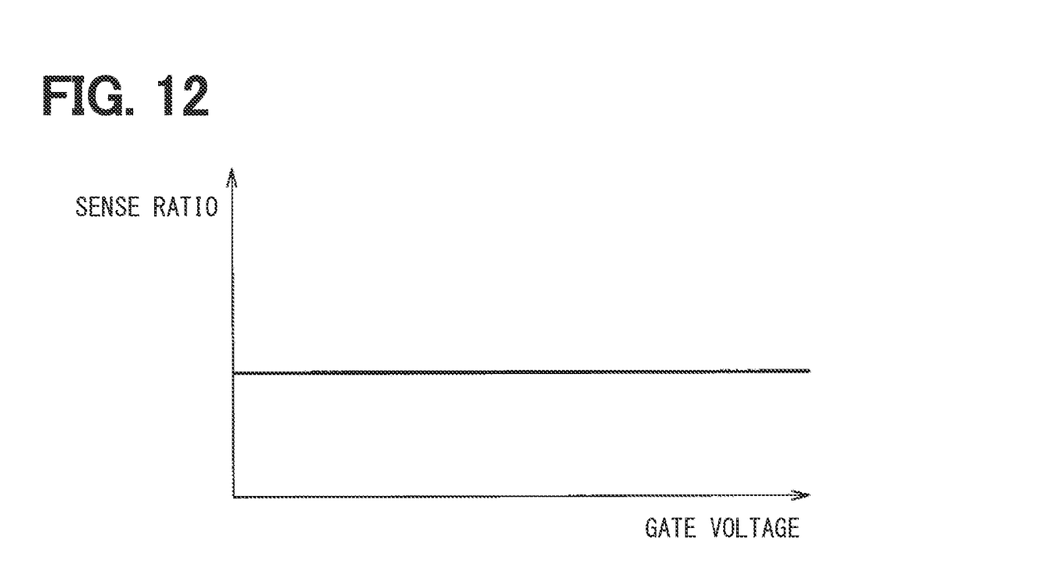
FIG. 12 is a diagram showing a relationship between a sense ratio and a gate voltage according to the second embodiment.

In contrast, if the resistance component layer 2a is provided as in the present embodiment, it is possible to reduce the sense current flowing into the sense cell region Rs. Therefore, Vgs dependency of the sense cell region Rs and the main cell region Rm is substantially matchable. Specifically, as shown in FIG. 12, Vgs dependency of the sense ratio can be eliminated, thereby adjusting the sense ratio to be substantially constant even when the gate voltage changes.

Therefore, Vgs dependency can be set suitably.

Other Embodiments

Although the present disclosure is made with reference to the embodiments described above, the present disclosure is not limited to such embodiments, but may include various changes and modifications which are within equivalent ranges. Furthermore, various combination and formation, and other combination and formation including one, more than one or less than one element may be made in the present disclosure.

(1) For example, in each of the above-described embodiments, the semiconductor substrate 1 forms a high-concentration impurity region, and the n⁻-type drift layer 2 is epitaxially grown thereon. Such a formation is merely an example of a case where a high concentration impurity region is formed on the opposite side of the p-type channel layer 3 across the drift layer, and a high concentration impurity region may also be formed by forming a drift layer with the semiconductor substrate and by performing ion implantation or the like on a back surface of the semiconductor substrate. Note that the impurity region including the semiconductor substrate 1 mentioned here corresponds to the second impurity region.

(2) In the above-described embodiments, the main cell region Rm is formed in a quadrangular shape to surround three sides of the sense cell region Rs, but such a formation is merely an example. For example, the main cell region Rm may have a shape other than a quadrangular shape. Also, the main cell region Rm may surround three sides of the sense cell region Rs and a part of the remaining one side thereof. Furthermore, other configuration in which the main cell region Rm has one corner of a quadrangular shape notched therefrom, and the sense cell region Rs makes up such a notch of the quadrangular shape may also be adoptable, for example.

(3) In the above-described embodiments, a vertical MOSFET having a double-layer trench gate structure is described as an example, but the double-layer structure is not indispensable, and a single-gate structure may be used. Further, a planar-type vertical MOSFET may also be used instead of the trench gate structure. That is, a vertical MOSFET of any structure may be adoptable for the present disclosure, as long as the structure includes (i) a gate electrode layer 8 formed on the surface of the p-type channel layer 3 with a gate insulating film 6 interposed therebetween, and (ii) the gate electrode layers 8 longitudinally extending in one direction and arranged side-by-side along the other direction that is orthogonal to the one extending direction. It may also be possible that, as long as having a longitudinally extending part in the gate electrode layer 8, two adjacent gate electrode layers 8 may be connected to each other at their tips having a half-circle shape.

(4) In the above-described embodiments, an n-type channel vertical MOSFET in which the first conductivity type is an n-type and the second conductivity type is a p-type is described as an example of a semiconductor switching element. However, such a configuration is only an example, and a semiconductor switching element having other structure, such as a p-type channel vertical MOSFET in which the conductivity type of each component is flipped with respect to an n-type channel may also be used. In addition to the vertical MOSFET, the present disclosure can also be applied to a vertical IGBT having a similar structure. The vertical IGBT is the same as the vertical MOSFET described in the above embodiments, except that the conductivity type of the semiconductor substrate 1 is changed from n-type to p-type.

The present embodiment has been described above with reference to the specific examples. However, the present disclosure is not limited to these specific examples. Modifications or changes made by a person skilled in the art to these specific examples as appropriate are included in the scope of the present disclosure as long as they have the features of the present disclosure. Each element included in the respective specific examples described above and the arrangement, conditions, shape, and the like of these elements are not limited to those exemplified and can be changed as appropriate. The respective elements included in the specific examples described above can be appropriately combined together as long as there occurs no technical contradiction between them.

What is claimed is:

1. A semiconductor device in which vertical semiconductor switching elements having a same structure are provided in a main cell region and a sense cell region, the semiconductor device comprising:

a drift layer of a first conductivity type;

a channel layer of a second conductivity type, arranged on the drift layer;

a first impurity region of the first conductivity type, arranged at a surface layer portion in the channel layer, the first impurity region having an impurity concentration higher than that of the drift layer;

a gate insulating film configured to cover the channel layer in an area between the first impurity region and the drift layer;

a gate electrode layer arranged in stripe-like plural lines extending in one direction and provided at a surface of the gate insulating film to form a channel region;

a second impurity region of the first or second conductivity type, arranged on an opposite side of the channel layer with the drift layer interposed therebetween, the second impurity region having an impurity concentration higher than that of the drift layer;

an upper electrode electrically connected to the first impurity region and the channel layer; and a lower electrode electrically connected to the second impurity region, wherein the sense cell region is defined as a quadrangular region surrounding an operating region of the semiconductor switching element formed as a sense cell, with (i) a lateral dimension of the sense cell region defined along the one direction of the main cell region, and (ii) a longitudinal dimension of the sense cell region defined along a longitudinal direction that is orthogonal to the lateral direction of the sense cell region, the longitudinal dimension of the sense cell region is equal to or greater than the lateral dimension of the sense cell region, each of the gate electrode layers continually extends in the one direction over the sense cell region and the main cell region, in an area where the sense cell region is provided, and a pitch of the gate electrode layers arranged in stripes in the sense cell region is larger than a pitch of the gate electrode layers arranged in stripes in the main cell region.

2. The semiconductor device according to claim 1, wherein the sense cell region includes a plurality of operating regions of the semiconductor switching elements respectively formed as the sense cell, and is defined as a quadrangular region surrounding the plurality of operating regions.

3. The semiconductor device according to claim 2, wherein the plurality of operating regions include two operating regions arranged side-by-side in the longitudinal direction.

4. The semiconductor device according to claim 1, wherein the semiconductor switching element is provided with a trench extending in the one direction and penetrating from the first impurity region through the channel layer to reach the drift layer, and the gate electrode layer is provided in the trench to extend in the trench extending direction with the gate insulating film interposed therebetween.

5. A semiconductor device in which vertical semiconductor switching elements having a same structure are provided in a main cell region and a sense cell region, the semiconductor device comprising:

a drift layer of a first conductivity type;

a channel layer of a second conductivity type, arranged on the drift layer;

a first impurity region of the first conductivity type, arranged at a surface layer portion in the channel layer, having an impurity concentration higher than that of the drift layer;

a gate insulating film configured to cover the channel layer in an area between the first impurity region and the drift layer;

a gate electrode layer arranged in stripe-like plural lines extending in one direction and provided at a surface of the gate insulating film to form a channel region;

a second impurity region of the first or second conductivity type, arranged on an opposite side of the channel layer with the drift layer interposed therebetween, the second impurity region having an impurity concentration higher than that of the drift layer;

an upper electrode electrically connected to the first impurity region and the channel layer; and a lower electrode electrically connected to the second impurity region, wherein a part of the drift layer in the sense cell region is provided with a resistance component layer that is configured to make the drift layer in the sense cell region higher in resistance than the drift layer in the main cell region.

* * * * *